(12) United States Patent
Yin et al.

(10) Patent No.: US 12,261,016 B1
(45) Date of Patent: Mar. 25, 2025

(54) ELECTRON DETECTION DEVICE AND SCANNING ELECTRON MICROSCOPE

(71) Applicant: CIQTEK CO., LTD., Anhui (CN)

(72) Inventors: Da Yin, Anhui (CN); Tianjun Li, Anhui (CN); Bin Sun, Anhui (CN); Wei Zhang, Anhui (CN); Feng Cao, Anhui (CN); Yu He, Anhui (CN)

(73) Assignee: CIQTEK CO., LTD., Anhui (CN)

( * ) Notice: Subject to any disclaimer, the term of this patent is extended or adjusted under 35 U.S.C. 154(b) by 0 days.

(21) Appl. No.: 19/008,683

(22) Filed: Jan. 3, 2025

Related U.S. Application Data

(63) Continuation of application No. PCT/CN2024/105340, filed on Jul. 12, 2024.

(30) Foreign Application Priority Data

Apr. 23, 2024  (CN) .......................... 202410490804.8

(51) Int. Cl.
*H01J 37/244* (2006.01)
*H01J 37/10* (2006.01)
*H01J 37/28* (2006.01)

(52) U.S. Cl.
CPC ............ *H01J 37/244* (2013.01); *H01J 37/28* (2013.01); *H01J 37/10* (2013.01); *H01J 2237/026* (2013.01); *H01J 2237/15* (2013.01)

(58) Field of Classification Search
CPC .......... H01J 37/244; H01J 37/28; H01J 37/10; H01J 2237/026; H01J 2237/15
See application file for complete search history.

(56) References Cited

U.S. PATENT DOCUMENTS

| | | | | |
|---|---|---|---|---|
| 5,387,793 A | * | 2/1995 | Sato | ...................... H01J 37/244 250/397 |
| 5,608,218 A | * | 3/1997 | Sato | ........................ H01J 37/28 250/310 |

(Continued)

FOREIGN PATENT DOCUMENTS

| | | |
|---|---|---|
| CN | 105340051 A | 2/2016 |
| CN | 109300759 A | 2/2019 |

(Continued)

OTHER PUBLICATIONS

International Search Report dated Sep. 6, 2024 in International Application No. PCT/CN2024/105340. English translation attached.

(Continued)

*Primary Examiner* — David A Vanore

(57) ABSTRACT

Provided are an electron detection device and a scanning electron microscope. The electron detection device includes: a reflective energy analyzer including first and second control electrodes that are sequentially arranged in an incidence direction of an electron beam; a first detector disposed at a side of the second control electrode away from the first control electrode; a second detector disposed at a side of the first control electrode away from the second control electrode; and a conductive shielding tube penetrating the first and second control electrodes in the incidence direction and configured to shield an electric field generated by the reflective energy analyzer, allowing the electron beam to pass through and be incident on the target sample. First control electrode is configured to generate a first electric field between the first and second control electrodes. The first electric field is configured to guide the secondary electron to the first detector.

18 Claims, 7 Drawing Sheets

(56) References Cited

U.S. PATENT DOCUMENTS

| | | | | |
|---|---|---|---|---|
| 6,043,491 A * | 3/2000 | Ose | ........................ | H01J 37/244 |
| | | | | 250/310 |
| 6,172,363 B1 * | 1/2001 | Shinada | ............... | G01R 31/307 |
| | | | | 850/10 |
| 6,444,981 B1 * | 9/2002 | Todokoro | ............... | H01J 37/28 |
| | | | | 250/311 |
| 10,777,382 B2 * | 9/2020 | Li | ........................... | H01J 37/28 |
| 11,251,018 B2 * | 2/2022 | Sohda | ................... | H01J 37/21 |
| 11,276,554 B2 * | 3/2022 | Ohashi | ................... | H01J 37/28 |
| 2002/0088940 A1 * | 7/2002 | Watanabe | ............. | H01J 37/224 |
| | | | | 250/310 |
| 2004/0075054 A1 * | 4/2004 | Knippelmeyer | ........ | H01J 37/28 |
| | | | | 250/307 |
| 2004/0108457 A1 * | 6/2004 | Kienzle | .................. | H01J 37/05 |
| | | | | 850/10 |
| 2005/0001165 A1 * | 1/2005 | Parker | .................. | H01J 37/244 |
| | | | | 250/310 |
| 2006/0097166 A1 * | 5/2006 | Ishitani | .................. | H01J 37/28 |
| | | | | 250/492.21 |
| 2008/0121803 A1 * | 5/2008 | Shojo | .................... | H01J 37/153 |
| | | | | 250/311 |
| 2008/0251718 A1 * | 10/2008 | Kaga | ........................ | H01J 37/28 |
| | | | | 250/310 |
| 2009/0212213 A1 * | 8/2009 | Nakasuji | ................. | H01J 37/28 |
| | | | | 250/442.11 |
| 2010/0133433 A1 * | 6/2010 | Tanimoto | ............. | H01J 37/244 |
| | | | | 250/310 |
| 2014/0299769 A1 * | 10/2014 | Okai | ........................ | H01J 37/28 |
| | | | | 250/310 |
| 2014/0361167 A1 * | 12/2014 | Morishita | ............... | H01J 37/28 |
| | | | | 250/310 |
| 2016/0071690 A1 * | 3/2016 | Shintake | ............... | H01J 37/244 |
| | | | | 250/305 |
| 2018/0076005 A1 * | 3/2018 | Haas | ...................... | G01R 29/08 |
| 2018/0261422 A1 * | 9/2018 | Kuramoto | ........... | H01J 37/3056 |
| 2020/0234914 A1 * | 7/2020 | Li | ............................ | H01J 37/28 |
| 2020/0273665 A1 * | 8/2020 | Morishita | ............. | H01J 37/1471 |
| 2021/0272770 A1 * | 9/2021 | Sohda | ................... | H01J 37/153 |
| 2022/0254597 A1 * | 8/2022 | Imai | ........................ | H01J 37/28 |
| 2022/0319798 A1 * | 10/2022 | Enyama | ................. | H01J 37/14 |
| 2022/0319805 A1 * | 10/2022 | Fang | ....................... | H01J 37/28 |
| 2023/0028903 A1 * | 1/2023 | Li | .......................... | H01J 37/244 |
| 2023/0317404 A1 * | 10/2023 | Li | ........................ | H01J 37/1474 |

FOREIGN PATENT DOCUMENTS

| | | |
|---|---|---|
| CN | 110383414 A | 10/2019 |
| CN | 110431649 A | 11/2019 |
| CN | 114220725 A | 3/2022 |
| CN | 114256043 A | 3/2022 |
| CN | 116631830 A | 8/2023 |
| CN | 118098914 A | 5/2024 |
| JP | H11242941 A | 9/1999 |
| JP | 2005093106 A | 4/2005 |

OTHER PUBLICATIONS

First Office Action from corresponding Chinese Application No. 202410490804.8, dated Jun. 4, 2024. English translation attached.
The Grant Notice from corresponding Chinese Application No. 202410490804.8, dated Jun. 19, 2024. English translation attached.

* cited by examiner

ELECTRON DETECTION DEVICE AND SCANNING ELECTRON MICROSCOPE

CROSS-REFERENCE TO RELATED APPLICATION

The present application is a continuation of International Application No. PCT/CN2024/105340 filed on Jul. 12, 2024, which claims priority to Chinese Patent Application No. 202410490804.8, titled "ELECTRON DETECTION DEVICE AND SCANNING ELECTRON MICROSCOPE", and filed on Apr. 23, 2024, the entire disclosure of which is incorporated herein by reference.

FIELD

This disclosure relates to the field of scanning electron microscope technologies, and in particular, to an electron detection device and a scanning electron microscope.

BACKGROUND

Scanning electron microscope uses a focused electron beam to scan and image a sample surface for characterization and analysis, and can be used for observation of sample surfaces or sample cross-sections in a number of fields. When the electron beam acts on a sample, signal electrons such as Secondary Electrons (SEs) and Backscattered Electrons (BSEs) are generated. An exit energy of the secondary electron is about 0 eV to 50 eV, and an exit energy of the backscattered electron is about 50 eV or more.

The secondary electron can reflect information about surface morphology of a sample, and the backscattered electron can reflect relevant information such as composition and crystal structure of the sample. Additionally, types of information carried by backscattered electrons of different energies are also different. For example, a backscattered electron with almost no energy loss generated by complete elastic scattering on the sample surface contains not only composition information but also information about a surface morphology structure. Therefore, for a signal detector of the scanning electron microscope, its goal is to fully distinguish signal electrons of different types/different energies, improve separation of the signal electrons of the different types/the different energies, and simultaneously improve collection efficiency (collect as many signal electrons as possible) to improve signal analysis capability and efficiency.

A traditional detector is generally laid out in a sample compartment region outside a lens barrel of the scanning electron microscope (for example, an Everhart-Thornley Detector (E-T detector), an in-lens backscattered detector), and a space occupied by the traditional detector enables an operating distance (i.e., a distance between a lower pole piece of an objective lens and the sample surface) during sample measurement to be very large, resulting in reduced resolution; at the same time, due to a limitation of the spatial layout, especially at a small operating distance, a mounting of the detector is inconvenient or requirements for mounting accuracy are not met, and most electrons enter the lens barrel reversely along a main optical axis and cannot be collected by a detector outside the lens barrel, resulting in reduced collection efficiency. In particular, for a semiconductor backscattered detector, an energy of the backscattered electron is low under a low landing voltage operating condition ranging from 1 kV to 3 kV, leading to problems such as insufficient detector signal strength.

SUMMARY

The present invention aims to solve one of the technical problems in the related art at least to some extent. To this end, objects of the present disclosure are to provide an electron detection device and a scanning electron microscope, to improve separation and collection efficiency of a backscattered electron and a secondary electron.

To achieve the above-mentioned objects, according to embodiments in a first aspect of the present disclosure, an electron detection device is provided. The electron detection device includes a reflective energy analyzer, a first detector, a second detector, and a conductive shielding tube. The reflective energy analyzer includes a first control electrode and a second control electrode that are sequentially arranged in an incidence direction of an electron beam. The first control electrode is configured to generate a first electric field between the first control electrode and the second control electrode. The first detector is disposed at a side of the second control electrode away from the first control electrode, and the first detector is configured to receive a secondary electron generated by the electron beam acting on a target sample. The second detector is disposed at a side of the first control electrode away from the second control electrode, and the second detector is configured to receive a backscattered electron generated by the electron beam acting on the target sample. The conductive shielding tube penetrates the first control electrode and the second control electrode in the incidence direction of the electron beam, and the conductive shielding tube is configured to shield an electric field generated by the reflective energy analyzer, allowing the electron beam to pass through and be incident on the target sample. The first electric field is configured to guide the secondary electron to the first detector.

To achieve the above-mentioned objects, according to embodiments in a second aspect of the present disclosure, a scanning electron microscope is provided. The scanning electron microscope includes an electron source and the electron detection device described in the above embodiments in the first aspect. The electron source is configured to generate an electron beam. The detection device is configured to detect the secondary electron and the backscattered electron that are generated by the electron beam acting on the target sample.

In the electron detection device and the scanning electron microscope according to the embodiments of the present disclosure, the first control electrode and the second control electrode of the reflective energy analyzer are sequentially arranged in the incidence direction of an electron beam, the first detector is disposed at the side of the second control electrode away from the first control electrode, and the second detector is disposed at the side of the first control electrode away from the second control electrode. Thus, the secondary electron may be guided to the first detector by the first electric field generated between the first control electrode and the second control electrode, and the backscattered electron moves to the second detector opposite to the first detector. Thus, by guiding the secondary electron to move in an opposite direction relative to the backscattered electron and receiving the secondary electron by corresponding detectors disposed opposite to each other, the separation and the collection efficiency of the backscattered electron and the secondary electron can be improved, and high-resolution backscattered electron, BSE, imaging at a small operating distance can be achieved, thereby improving signal intensity of the backscattered electron under a low landing voltage condition.

Figure 1:
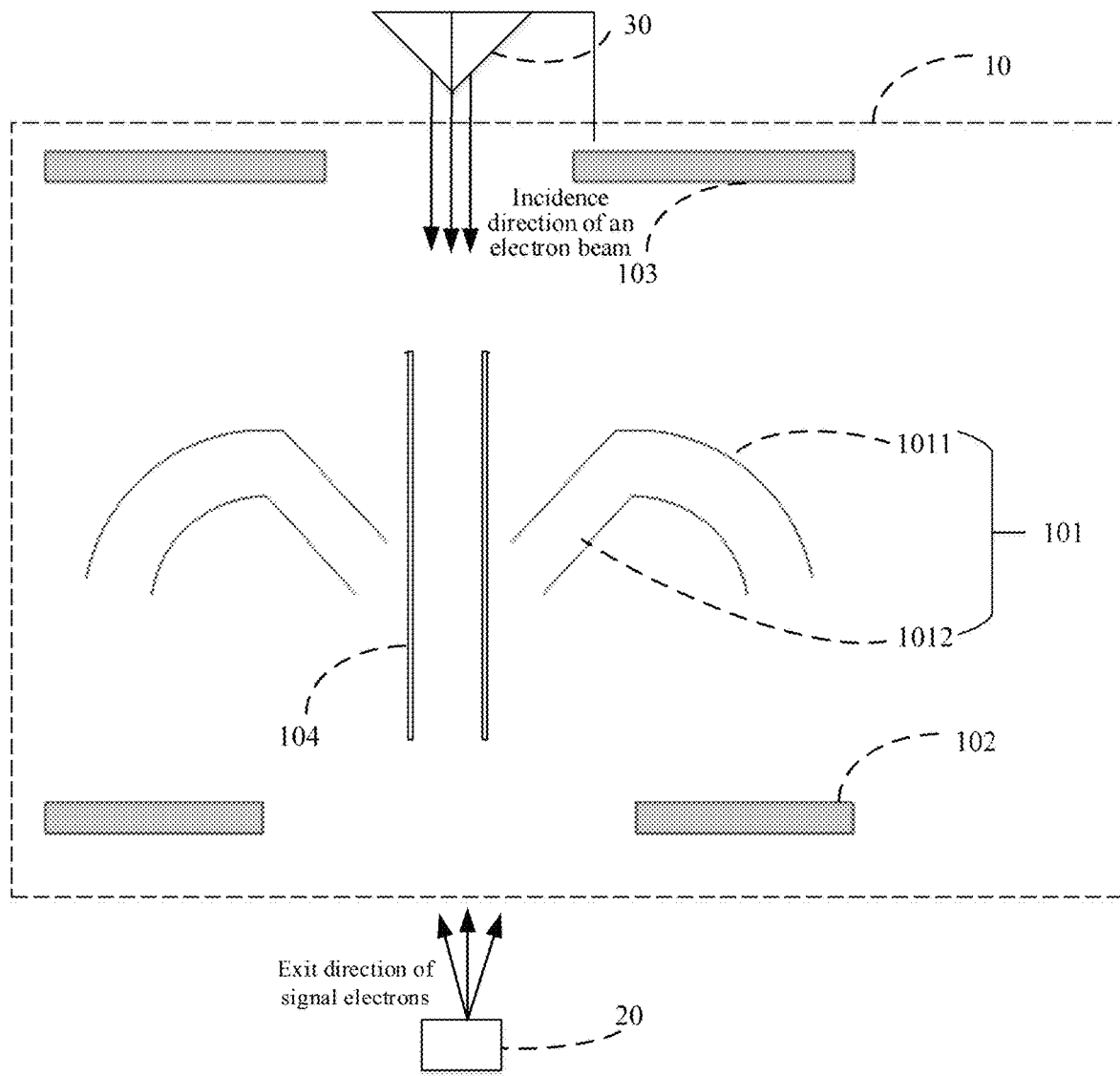
FIG. 1 is a schematic diagram of a structure of a reflective energy analyzer according to an embodiment of the present disclosure.

REFERENCE NUMERALS 100, scanning electron microscope;
10, electron detection device; 20, target sample; 30, electron source; 40, objective lens; 50, condenser; 60, voltage tube;
101, reflective energy analyzer; 102, first detector; 103, second detector; 104, conductive shielding tube;
1011, first control electrode; 1012, second control electrode; 1013, third control electrode.

DETAILED DESCRIPTION OF THE EMBODIMENTS

The embodiments of the present disclosure will be described in detail below with reference to examples thereof as illustrated in the accompanying drawings, throughout which same or similar elements, or elements having same or similar functions, are denoted by same or similar reference numerals. The embodiments described below with reference to the drawings are illustrative only, and are intended to explain rather than limit the present disclosure.

To this end, the present disclosure provides an electron detection device. The device has a first control electrode and a second control electrode that are sequentially arranged in an incidence direction of an electron beam to generate a first electric field, and the first electric field is provided to guide a secondary electron to move in an opposite direction to a backscattered electron, to guide the backscattered electron and the secondary electron to two opposite detectors, respectively, to improve separation and collection efficiency of the two electrons.

The electron detection device and the scanning electron microscope according to embodiments of the present disclosure will be described below with reference to the accompanying drawings.

FIG. 1 is a schematic diagram of a structure of an electron detection device according to an embodiment of the present disclosure.

As shown in FIG. 1, the electron detection device 10 includes a reflective energy analyzer 101, a first detector 102, a second detector 103, and a conductive shielding tube 104. The reflective energy analyzer 101 includes a first control electrode 1011 and a second control electrode 1012 that are sequentially arranged in an incidence direction of an electron beam. The first control electrode 1011 is configured to generate a first electric field between the first control electrode 1011 and the second control electrode 1012. The first detector 102 is disposed at a side of the second control electrode 1012 away from the first control electrode 1011, and the first detector 102 is configured to receive a secondary electron generated by the electron beam acting on a target sample 20. The second detector 103 is disposed at a side of the first control electrode 1011 away from the second control electrode 1012, and the second detector 103 is configured to receive a backscattered electron generated by the electron beam acting on the target sample 20. The conductive shielding tube 104 penetrates the first control electrode 1011 and the second control electrode 1012 in the incidence direction of the electron beam, and the conductive shielding tube 104 is configured to shield an electric field (which may include the above-mentioned first electric field) generated by the reflective energy analyzer 101, allowing the electron beam to pass through and be incident on the target sample 20. The first electric field is provided to guide the secondary electron to the first detector 102.

In one embodiment, as shown in FIG. 1, the electron beam is generated by an electron source 30 of a scanning electron microscope, and moves in the incidence direction to act on the target sample 20 below, generating signal electrons (including the secondary electron and the backscattered electron) moving upwards. The electron detection device 10 is disposed between the electron source 30 and the target sample 20. The second detector 103 is disposed close to the electron source 30, and the first detector 102 is disposed close to the target sample 20. The first control electrode 1011 is disposed close to the second detector 103, and the second control electrode 1012 is disposed close to the first detector 102.

When in use, the first control electrode 1011 and the second control electrode 1012 are set to different potentials, and therefore the first electric field is generated between the first control electrode 1011 and the second control electrode 1012. Since an energy of the secondary electron and an energy of the backscattered electron are different, the secondary electron and the backscattered electron of the signal electrons moving upwards can be separated under the action of the first electric field. The secondary electron with a less energy is guided to the first detector 102 below for reception under the action of the first electric field, and the backscattered electron with a greater energy can pass through the first electric field and move to the second detector 103 above for reception. Thus, by guiding the secondary electron to move in the opposite direction to the backscattered electron, the separation and the collection efficiency of the secondary electron and the backscattered electron can be improved.

It should be noted that the above-mentioned different potentials do not mean opposite potentials, but different potentials. The first control electrode 1011 and the second control electrode 1012 can both be positive potentials. In addition, an energy threshold of the backscattered electron passing through can be changed by adjusting a potential of the first control electrode 1011, to realize energy analysis of the backscattered electron.

In some examples, after the secondary electron exits upwards, the secondary electron is bent by the first electric field generated by the reflective energy analyzer 101, moves in an opposite direction of an exit direction (i.e. downwards), and can form a convergence effect at a specific distance below the second control electrode 1012, to be received by the first detector 102. After the backscattered electron passes through the first electric field, the backscattered electron forms a certain divergence angle, and continues to move upwards to the second detector 103, and is received by the second detector 103.

As an example, the second detector 103 can be an energy-free filter or an energy filter to selectively allow backscattered electrons of different energies to pass through.

In the electron detection device 10 according to the embodiments of the present disclosure, the secondary electron is guided by the reflective energy analyzer 101 to move in the opposite direction to the backscattered electron, and the secondary electron exits the first electric field in an opposite direction of the exit direction and continues to move in the direction in which the secondary electron exits the first electric field, and the backscattered electron moves in a direction in which the backscattered electron exits the first electric field. In this way, a distinguishable detection of the secondary electron and the backscattered electron is realized with high efficiency and high purity. Since the backscattered electron and the secondary electron can be distinguished and detected with the high collection efficiency and the high purity, an imaging signal-to-noise ratio can be improved. At the same time, since a backscattered detector (i.e., the second detector 103) no longer occupies a space between the objective lens and the sample, the target sample 20 can be imaged at a smaller operating distance (the distance from the lower end face of the objective lens), thereby improving imaging resolution.

Figure 2:
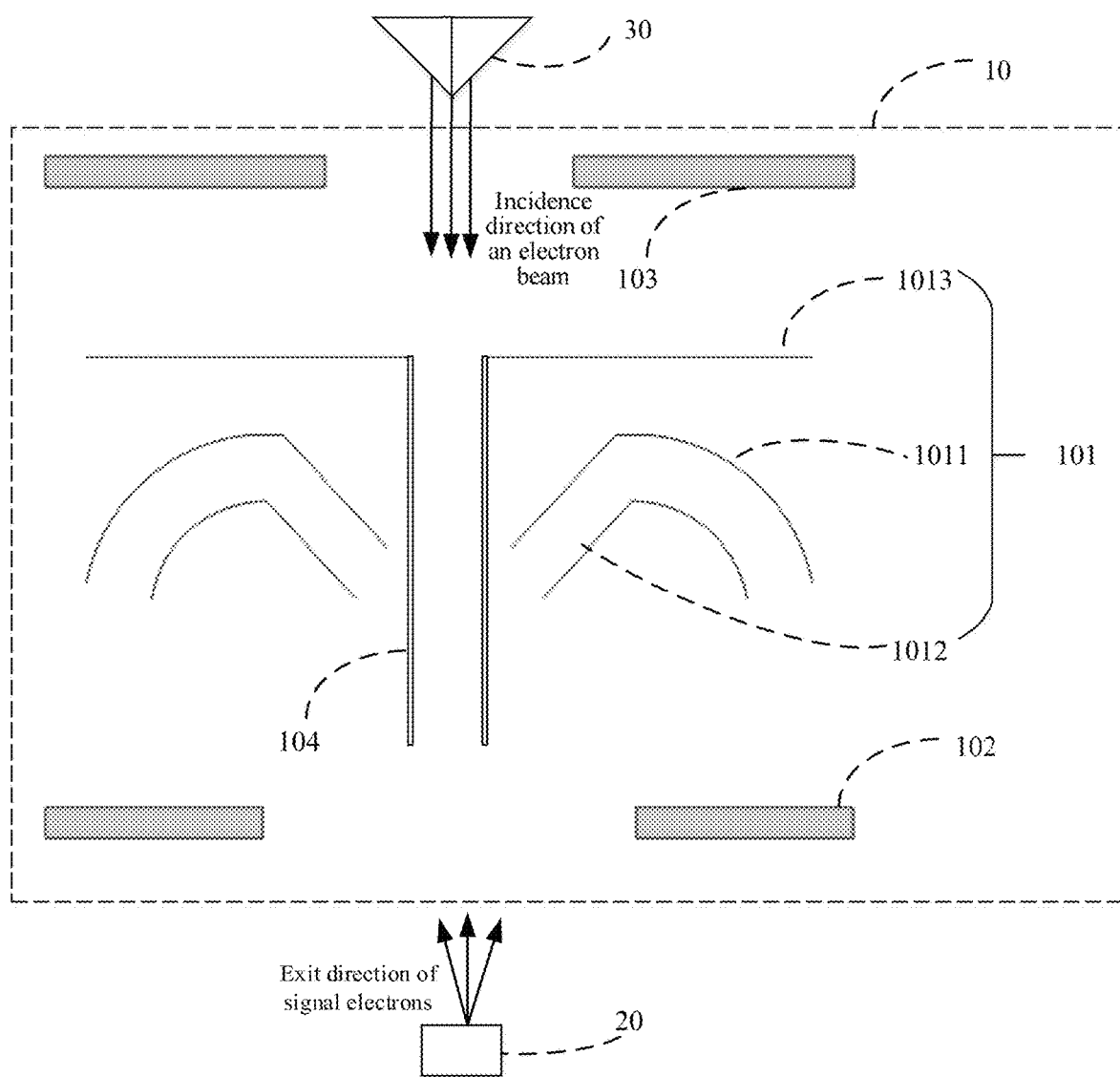
FIG. 2 is a schematic diagram of a structure of a reflective energy analyzer according to another embodiment of the present disclosure.

In some embodiments of the present disclosure, as shown in FIG. 2, the reflective energy analyzer 101 further includes a third control electrode 1013. The third control electrode 1013 is disposed at the side of the first control electrode 1011 away from the second control electrode 1012 in the incidence direction of the electron beam and is penetrated by the conductive shielding tube 104.

The first control electrode 1011 is located between the third control electrode 1013 and the second control electrode 1012. The second detector 103 is disposed at a side of the third control electrode 1013 away from the first control electrode 1011. The first control electrode 1011 is further configured to generate a second electric field between the first control electrode 1011 and the third control electrode 1013, and the second electric field is configured to guide the backscattered electron to the second detector 103.

In one embodiment, referring to FIG. 2, the conductive shielding tube 104 sequentially penetrates the third control electrode 1013, the first control electrode 1011, and the second control electrode 1012 in the incidence direction of the electron beam, and the conductive shielding tube 104 is configured to shield an electric field (including the first electric field and the second electric field that are described above) generated by the reflective energy analyzer 101. The third control electrode 1013 and the second control electrode 1012 can be set to the same potential, while the first control electrode 1011 and the third control electrode 1013 can be set to different potentials. Thus, a first electric field is generated between the first control electrode 1011 and the second control electrode 1012, and a second electric field is generated between the third control electrode 1013 and the first control electrode 1011. Since an energy of the secondary electron and an energy of the backscattered electron are different, the secondary electron and the backscattered electron of the signal electrons moving upwards can be separated under the action of the first electric field and the second electric field. The secondary electron with a less energy is guided to the first detector 102 below for reception under the action of the first electric field below, and the backscattered electron with a greater energy can pass through the first electric field, enter the second electric field, and is guided to the second detector 103 above for reception. Thus, the separation and the collection efficiency of the secondary electron and the backscattered electron can be improved by guiding the secondary electron and the backscattered electron to move in the opposite directions.

Figure 3:
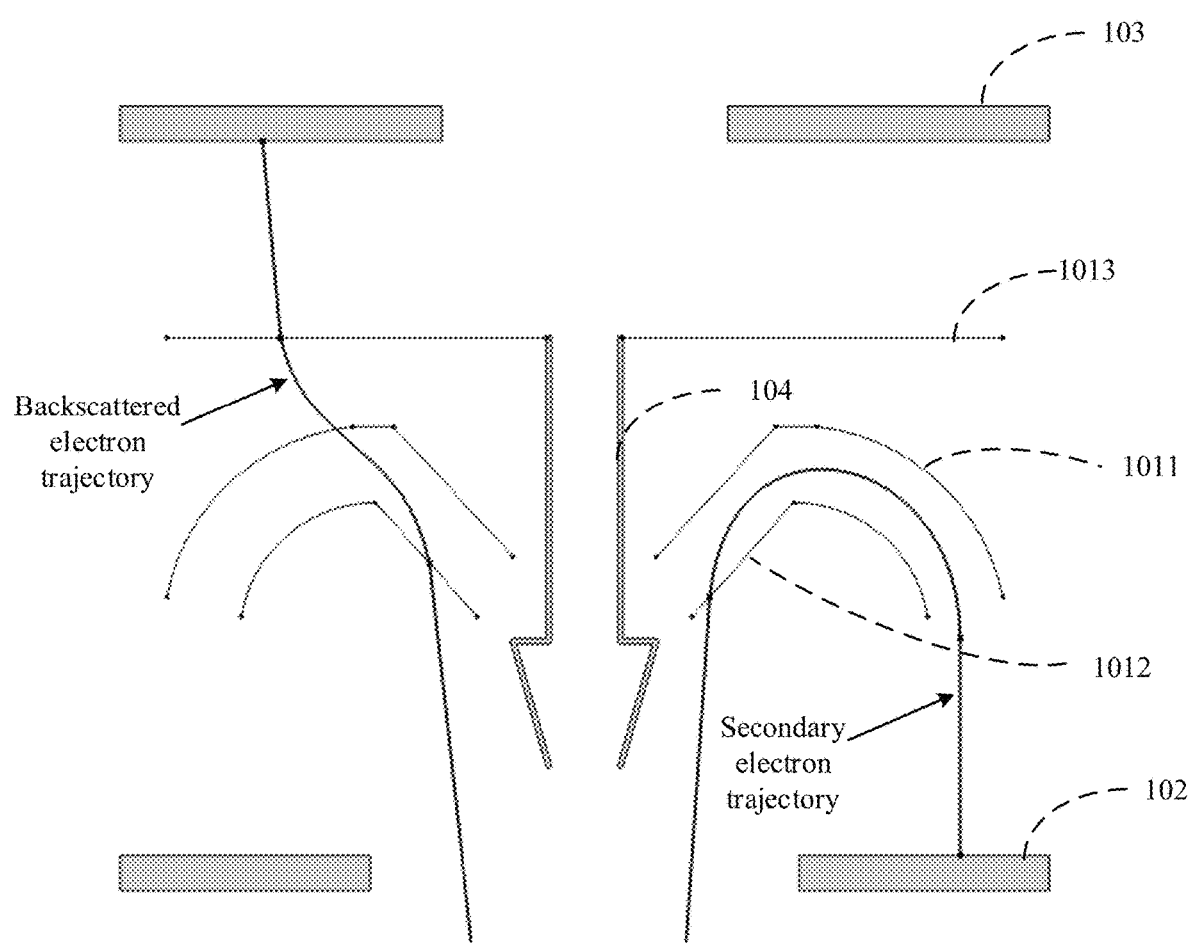
FIG. 3 is a schematic diagram of a movement trajectory of a secondary electron and a backscattered electron according to an embodiment of the present disclosure.

In some examples, as shown in FIG. 3, after the secondary electron exits upwards, the secondary electron is bent by the first electric field generated by the reflective energy analyzer 101, moves in an opposite direction of an exit direction (i.e. downwards), and can form a convergence effect at a specific distance below the second control electrode 1012, to be received by the first detector 102. After the backscattered electron passes through the first electric field, the backscattered electron forms a certain divergence angle, and continues to move upwards and enter the second electric field; the backscattered electron forms a larger divergence angle under the action of the second electric field, and continues to move in the direction in which the backscattered electron exits the second electric field to the second detector 103, and is received by the second detector 103.

Thus, in the electron detection device 10, the secondary electron and the backscattered electron are guided by the reflective energy analyzer 101 to move in the opposite directions to each other. The secondary electron exits the first electric field in the opposite direction of the exit direction and continues to move in the direction in which the secondary electron exits the first electric field; and the backscattered electron exits the second electric field at a certain divergence angle and continues to move in the direction in which the backscattered electron exits the second electric field. In this way, the distinguishable detection of the secondary electron and the backscattered electron is realized with higher efficiency than that in the embodiments shown in FIG. 1, and with higher purity.

In some embodiments of the present disclosure, referring to FIG. 1, FIG. 2, and FIG. 3, the first control electrode 1011 has an axisymmetric structure and has a through hole at a center of the first control electrode 1011. The through hole allows the electron beam to pass through, and a center line of the through hole coincides with a symmetry axis. The first control electrode 1011 extends outwards from the symmetry axis as a center to form an extension surface. The extension surface is a curved surface with a downward opening (a cross-sectional shape of the curved surface can be a parabola shape, an arc shape, a Bezier curve shape, etc.), and a side of the curved surface away from the symmetry axis points towards the first detector 102. The symmetry axis is an axis where the incidence direction of the electron beam is located. The second control electrode 1012 has a same shape as the first control electrode 1011, and the second control electrode 1012 and the first control electrode 1011 together define an interlayer, to enable the first electric field formed within the interlayer to guide the secondary electron to be deflected onto the first detector 102 and received by the first detector 102.

In one embodiment, referring to FIG. 2 and FIG. 3, each of the third control electrode 1013, the first control electrode 1011, and the second control electrode 1012 can be of an axisymmetric structure, and a symmetry axis of each of the third control electrode 1013, the first control electrode 1011, and the second control electrode 1012 is an axis where the incidence direction of the electron beam is located. The third control electrode 1013 can be of a flat plate structure, such as a circular flat plate; and a cross section of the second control electrode 1012 and the first control electrode 1011 coplanar with the symmetry axis can be of an approximately M-shaped structure, and an opening of the approximately M-shaped structure faces towards the first detector 102. The secondary electron with the lower energy can move to the first detector 102 along a secondary electron trajectory shown in FIG. 3 under the action of the first electric field, and the backscattered electron with the higher energy passes through the first electric field and moves to the second detector 103 along a backscattered electron trajectory shown in FIG. 3 under the action of the second electric field. Thus, the separation and the collection efficiency of the secondary electron and the backscattered electron can be improved.

In some embodiments of the present disclosure, each of the third control electrode 1013, the first control electrode 1011, and the second control electrode 1012 is of a netlike structure or a perforated structure.

In this embodiment, the third control electrode 1013 of the netlike structure or the perforated structure, the first control electrode 1011 of the netlike structure or the perforated structure, and the second control electrode 1012 of the netlike structure or the perforated structure can allow most of the secondary electrons and the backscattered electrons to pass through while generating the first electric field and the second electric field.

In some embodiments of the present disclosure, as shown in FIG. 3, the conductive shielding tube 104 is symmetrically disposed about the axis where the incidence direction of the electron beam is located (i.e., a same symmetric axis as the third control electrode 1013, the first control electrode 1011, and the second control electrode 1012), and can be at a same potential as a voltage tube of the scanning electron microscope (e.g., both are positive potentials).

In this embodiment, the conductive shielding tube 104 maintains an equipotential zone on the electron beam path to avoid an influence of the electric field generated by the reflective energy analyzer 101 on the electron beam.

In some embodiments of the present disclosure, a part of the conductive shielding tube 104 close to the target sample 20 has a conical structure with an opening. An outer surface of the conical structure has a reflective effect and can be plated with a metal that improves reflection efficiency, which is configured to reflect signal electrons incident on the outer surface of the conical structure. Some of the reflected signal electrons can enter the reflective energy analyzer 101 for detection, which can reduce leakage of electrons from a central hole to improve the electron collection efficiency.

As an example, the part of the conductive shielding tube 104 close to the electron source 30 can be of a hollow cylindrical structure, and a diameter of the cylindrical structure can be set as desired. For example, increasing the diameter can make it less likely for the incident electron beam to be blocked when passing through the conductive shielding tube 104 from top to bottom, thereby reducing difficulty of assembling and centring of the structure. A diameter of an opening at top of a cone can be smaller than 2 mm to reduce the signal electrons entering the conductive shielding tube 104 and increase the signal electrons entering the reflective energy analyzer 101, thereby improving the electron collection efficiency.

Figure 4:
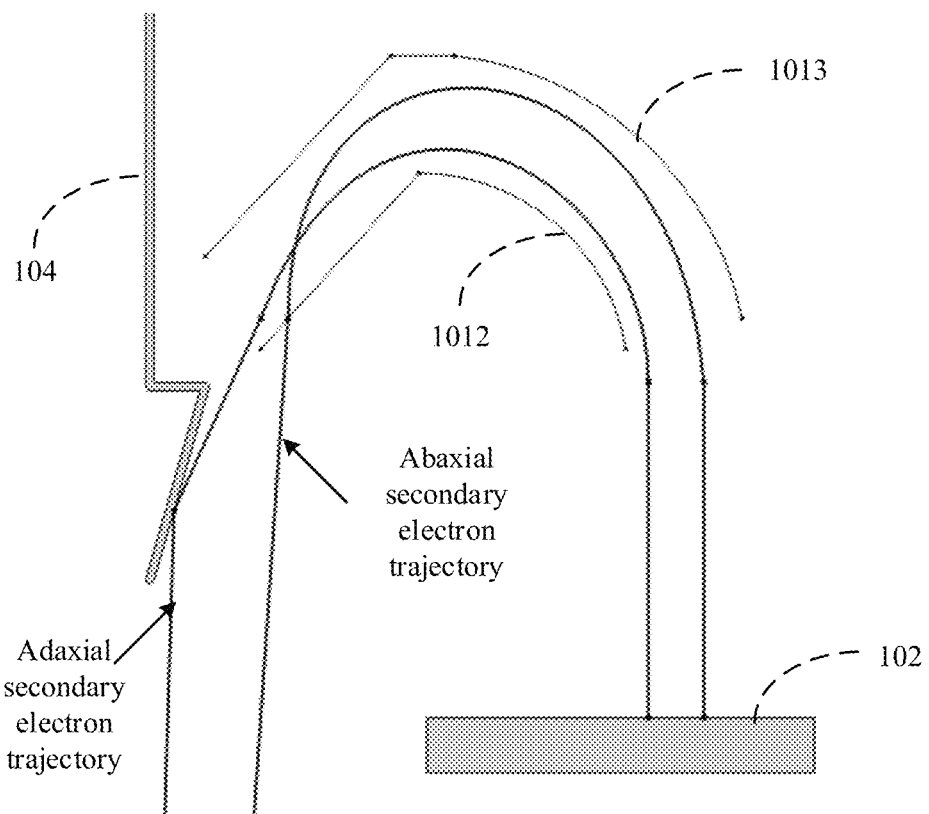
FIG. 4 is a schematic diagram of a movement trajectory of an adaxial secondary electron and an abaxial secondary electron according to an embodiment of the present disclosure.

In one embodiment, the secondary electron and the backscattered electron are incident on the outer surface of the conical structure at a small angle, and have a greater probability of elastic scattering or inelastic scattering, and the scattering angle is in a cone reflection direction or in a direction close to a cone reflection angle. The secondary electron is taken as an example. As shown in FIG. 4, an adaxial secondary electron is scattered by the outer surface of the conical structure and then enters the first electric field, while an abaxial secondary electron directly enters the first electric field.

Thus, by configuring the part of the conductive shielding tube 104 close to the target sample 20 into the conical structure, in a case of a same tube inner diameter of the conductive shielding tube 104, an aperture at a lowermost end of the tube is reduced with the conical structure, and the signal electrons leaking from an inside of the conductive shielding tube 104 are thus reduced, to allow more signal electrons (the secondary electrons and the backscattered electrons) to collide with the outer surface of the conical structure. As a result, the signal electrons subjected to collision are ejected into the reflective energy analyzer 101, thereby improving the collection efficiency of the signal electrons and alleviating a central black hole effect caused by a change of the signal electron collection efficiency with a scanning current.

In this embodiment, each of the first detector 102 and the second detector 103 can have a hollow ring structure, and the hollow ring structure can be symmetrical about the axis where the incidence direction of the electron beam is located. A hollow diameter can be large as long as it does not affect an incident electron beam, and precise alignment is not required.

In particular, due to the structure of the electron detection device 10 applied in the present disclosure, a central aperture of the first detector 102 receiving the secondary electrons can be larger to allow a high-angle backscattered electron to pass through, avoiding, in the related art, reducing the central aperture of the first detector 102 in order to receive as many secondary electrons as possible. An influence of the high-angle backscattered electrons is correspondingly received as the aperture is reduced. Therefore, signal data received by the first detector 102 is doped with the secondary electron and the backscattered electron. Thus, purity of the secondary electron receiving data is reduced, leading to errors in subsequent data analysis and image formation.

For the first detector 102, when its central opening is larger, signal electrons in a larger angle range can enter the reflective energy analyzer 101 (that is, more signal electrons enter the reflective energy analyzer 101), and are received by the first detector 102 and the second detector 103 respectively under the action of the reflective energy analyzer 101, thereby improving the collection efficiency and the collection purity of the signal electrons. In the related art, a scanning electron microscope with a coaxial detector in a lens barrel has a very small detector center hole to ensure the collection efficiency. The small center hole requires the detector to be accurately aligned with a main optical axis (i.e., the axis where the electron beam incidence direction is located), which increases difficulty of assembling and debugging. Based on this, the structure disclosed by the present disclosure can improve the collection efficiency and the collection purity of the signal electrons by the detector compared with the related art, and it is not necessary to accurately align the detector, reducing the difficulty of the assembling and the alignment.

Figure 5:
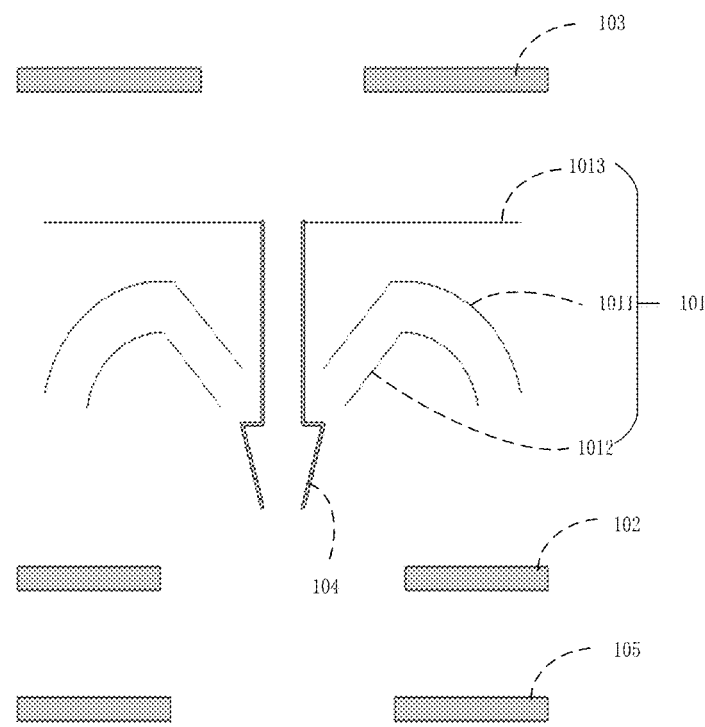
FIG. 5 is a schematic diagram of a structure of an electron detection device according to another embodiment of the present disclosure.

In some embodiments of the present disclosure, as shown in FIG. 5, the electron detection device 10 further includes a third detector 105. The third detector 105 is disposed at a side of the first detector 102 away from the second control electrode 1012, and the third detector 105 is configured to receive the backscattered electron generated by the electron beam acting on the target sample 20. An exit angle of the backscattered electron received by the third detector 105 is smaller than an exit angle of the backscattered electron received by the second detector 103.

In one embodiment, the third detector 105 can be configured to receive a medium-angle backscattered electron and a low-angle backscattered electron, the second detector 103 can be configured to receive a high-angle backscattered electron, and the first detector 102 is configured to receive a secondary electron that is reversed by the first electric field. A movement trajectory of each electron is shown in FIG. 6.

Figure 6:
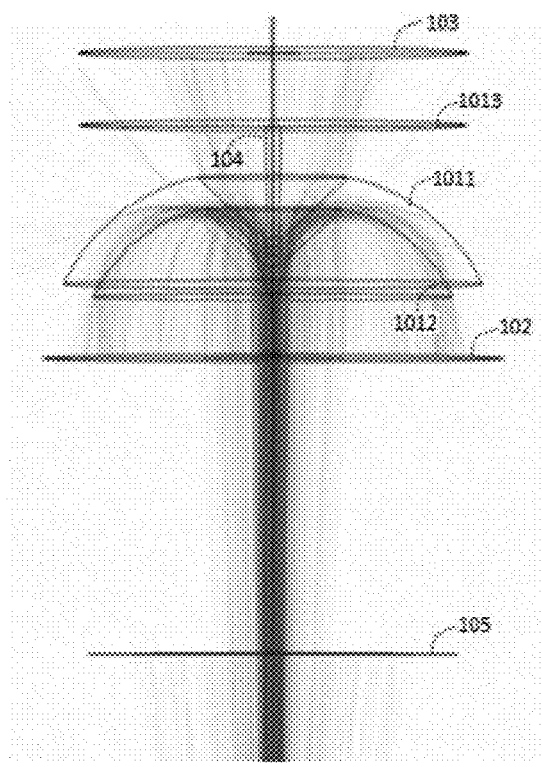
FIG. 6 is a schematic diagram of a multi-electron trajectory according to an embodiment of the present disclosure.

In this embodiment, referring to FIG. 5 and FIG. 6, the third detector 105, like the second detector 103 and the first detector 102, can also have a hollow ring structure, and the hollow ring structure can also be symmetrical about the axis where the incidence direction of the electron beam is located. A size of the central opening can be set as desired to avoid affecting the collection of the secondary electron and the high-angle backscattered electron.

As an example, the second detector 103, the first detector 102, and the third detector 105 can be any one of a scintillator+light pipe+photomultiplier tube detector, a scintillator+photon detector, or a semiconductor detector.

Figure 7:
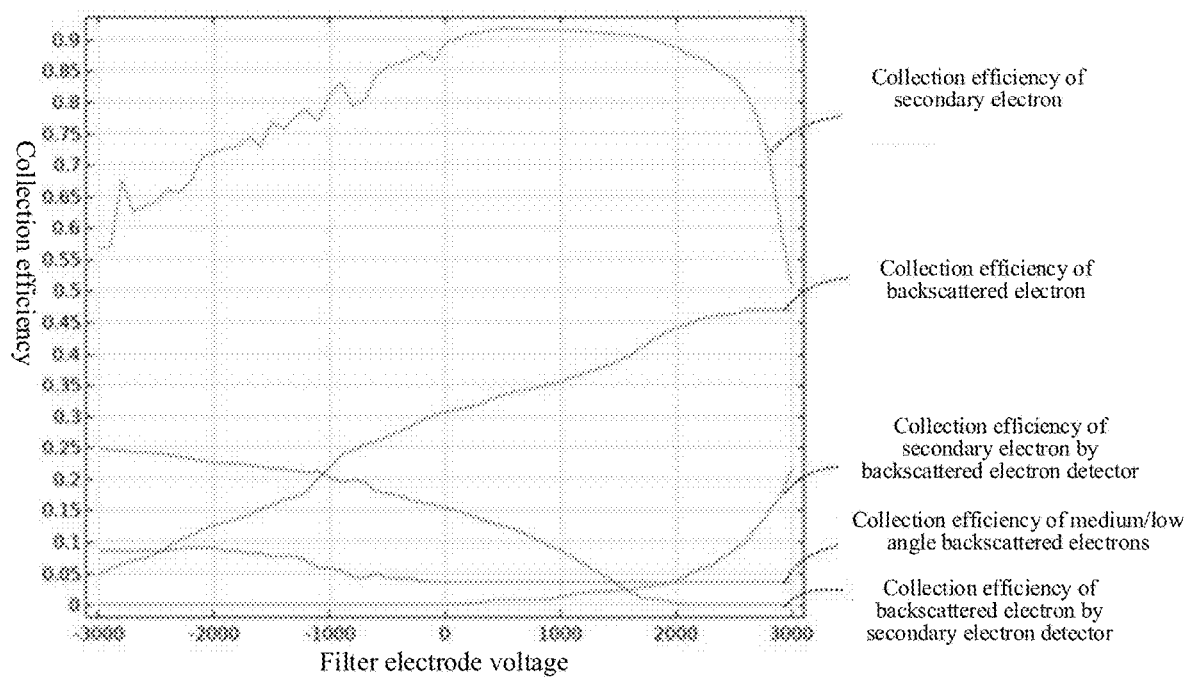
FIG. 7 is a graph of a relationship between a voltage of a first control electrode and collection efficiency according to an embodiment of the present disclosure.

In conjunction with FIG. 7, an example will be used below to illustrate the collection efficiency of the electron by the electronic detection device 10 of the present disclosure.

A voltage of the first control electrode 1011 ranging from −3 KV to 3 KV, an operating distance of 1 mm, and a landing voltage of 1 kV will be described as an example, to obtain the collection efficiency of the secondary electron, the collection efficiency of the backscattered electron, the collection effiency of the backscattered electron by the secondary electron detector, the collection effiency of the secondary electron by the backscattered electron detector, and collection efficiency of medium/low angle backscattered electrons. As shown in FIG. 7, during operation at a small distance operation, the backscattered electron and the secondary electron are separated by the third control electrode 1013, the first control electrode 1011, and the second control electrode 1012, and then the backscattered electron and the secondary electron are collected separately. In this way, the collection efficiency of the secondary electron can reach more than 70%, and the collection efficiency of the backscattered electron can reach more than 35%.

Corresponding to the electron detection device of the above embodiments, according to the present disclosure, a scanning electron microscope is also provided.

Figure 8:
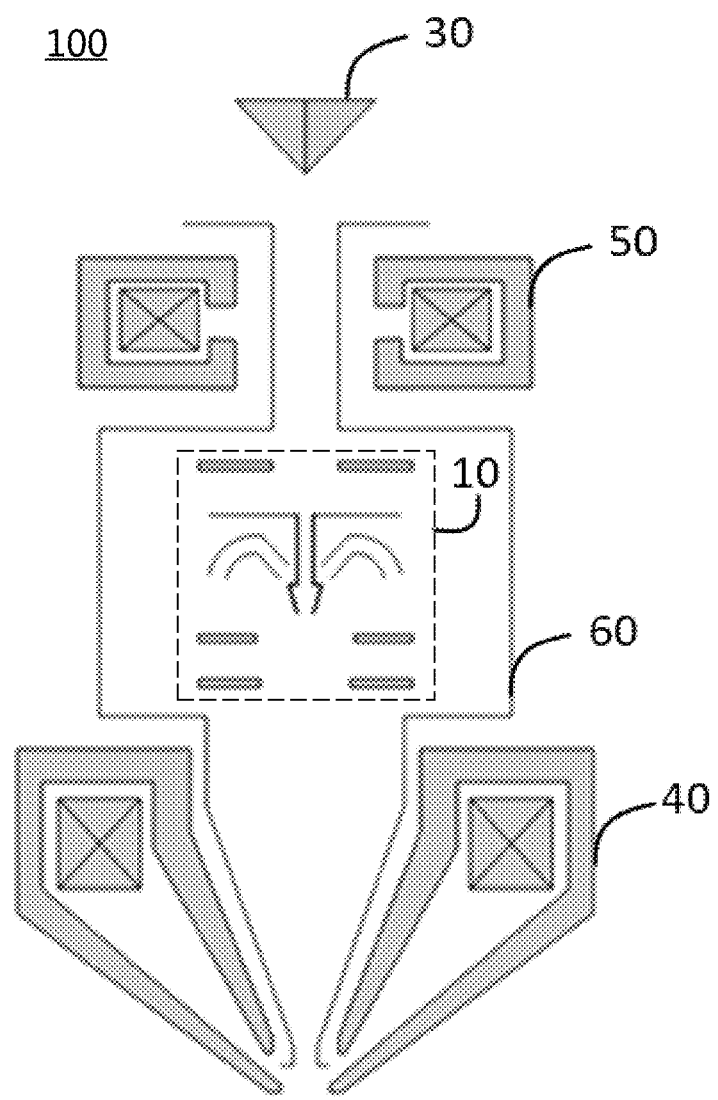
FIG. 8 is a schematic diagram of a structure of a scanning electron microscope according to an embodiment of the present disclosure.

FIG. 8 is a schematic diagram of a structure of a scanning electron microscope according to an embodiment of the present disclosure.

As shown in FIG. 8, the scanning electron microscope 100 includes an electron source 30, and the electron detection device 10 described above. The electron source 30 is configured to generate an electron beam; and the electron detection device 10 is configured to detect the secondary electron and the backscattered electron that are generated by the target sample 20 acting on the electron beam.

As an example, an emission mode of the electron source 30 can be one of thermal emission, thermal field emission, or cold field emission.

The scanning electron microscope 100 according to the embodiments of the present disclosure can improve the separation and the collection efficiency of the backscattered electron and the secondary electron through the equipped electron detection device 10.

In some embodiments of the present disclosure, as shown in FIG. 8, the scanning electron microscope 100 further includes an objective lens 40, a condenser 50, and a voltage tube 60. The voltage tube 60 has an accommodation cavity, and the accommodation cavity is configured to accommodate the electron detection device 10 (i.e., the electron detection device 10 is disposed in a lens barrel of the scanning electron microscope 100). The condenser lens 50 is arranged around the voltage tube 60 and disposed between the electron source 30 and the electron detection device 10, and the condenser lens 50 is configured to converge the electron beam. The objective lens 40 is arranged around the voltage tube 60 and disposed between the electron detection device 10 and the target sample 20, and the objective lens 40 is configured to focus the electron beam onto the target sample 20.

In this embodiment, the voltage tube 60 is further configured to accelerate the electron beam prior to the electron beam entering the electron detection device 10, decelerate the electron beam through a retarding electric field formed between the voltage tube 60 and the objective lens 40 subsequent to the electron beam passing through the electron detection device 10. The signal electrons generated by the target sample 20 are reversely accelerated through the retarding electric field.

As an example, the condenser 50 and the objective lens 40 may be one of a magnetic lens, an electric lens, or an electromagnetic compound lens.

Figure 9:
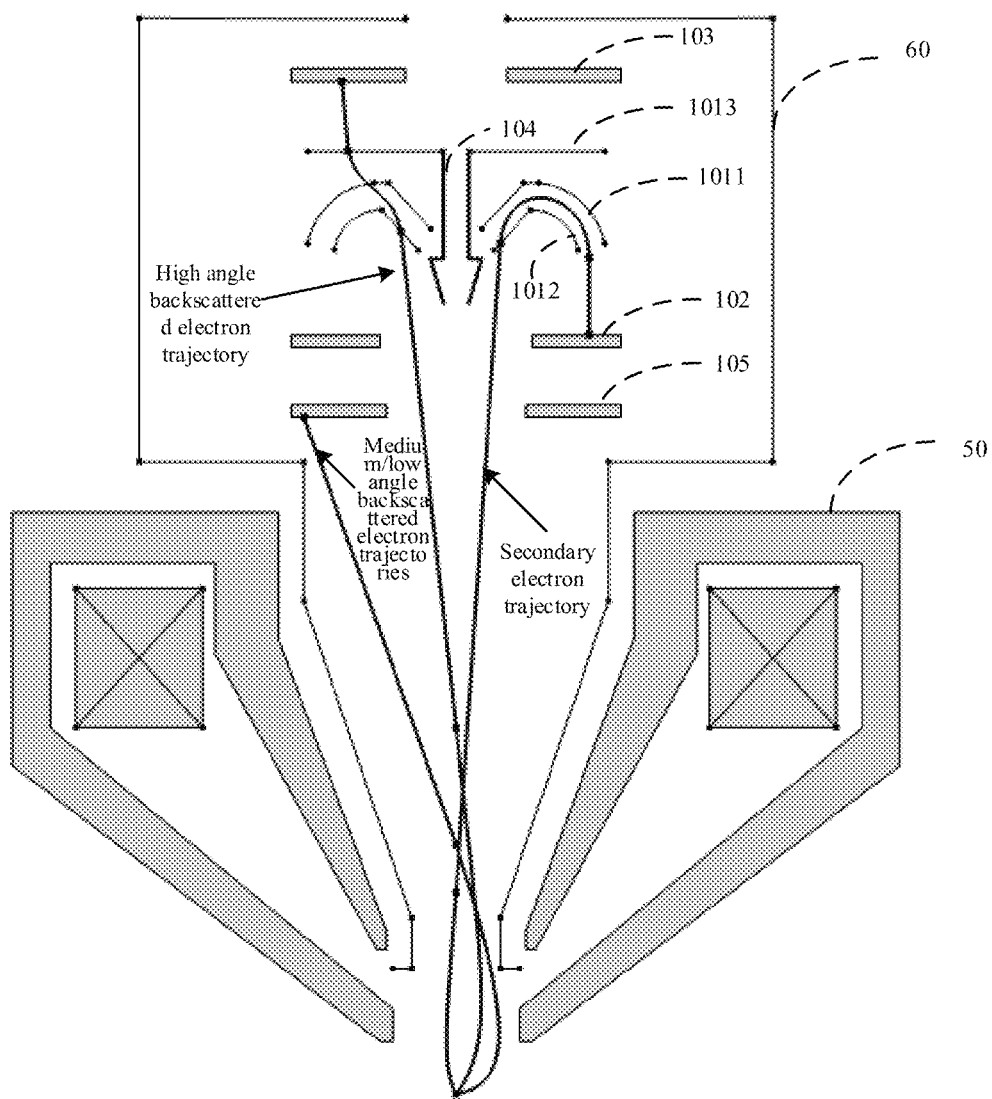
FIG. 9 is a schematic diagram of a trajectory of a secondary electron, a high-angle backscattered electron, and a medium/low-angle backscattered electron according to an embodiment of the present disclosure.

In some embodiments of the present disclosure, as shown in FIG. 9, the electron detection device 10 further includes a conductive shielding tube 104. The conductive shielding tube 104 penetrates the third control electrode 1013, the first control electrode 1011, and the second control electrode 1012 in the incidence direction of the electron beam, and the conductive shielding tube 104 is symmetrical about the axis where the incidence direction of the electron beam is located. The conductive shielding tube 104 is at a same potential as the voltage tube 60 and configured to shield the electric field generated by the reflective energy analyzer 101 to allow the electron beam to pass through and be incident on the target sample 20 without interference.

In some embodiments of the present disclosure, a potential of the objective lens 40 is a ground potential, a potential of the target sample 20 is a ground potential or a negative potential, and a potential of the voltage tube 60 is a positive potential. As a result, an electric field is generated between the objective lens 40 and the target sample 20, and an electric field is also generated between the target sample 20 and the voltage tube 60. Each of the two electric fields is generated at an end of the voltage tube 60, and therefore the voltage tube 60 can reversely accelerate the secondary electron and the backscattered electron that are generated by the target sample 20 through the above-mentioned retarding electric field, while the secondary electron and the backscattered electron that are generated by the target sample 20 can accelerate through the above-mentioned two electric fields generated with the target sample 20.

It should be noted that the objective lens 40 has lower spherical aberration and chromatic aberration, which can greatly improve resolution at a low landing voltage. At the same time, for signal electrons exiting from a surface of the target sample 20, the electric field at the end of the high-voltage tube (i.e., the voltage tube 60) can provide an accelerating effect such that the signal electrons accelerate along the optical axis. A direction of the signal electrons is opposite to a direction of the electron beam generated by the electron source 30, such that the signal electrons have high energy when they reach the electron detection device 10, thereby improving signal strength.

A procedure of the scanning electron microscope 100 disclosed in the present disclosure will be described below in conjunction with FIG. 9.

The electron source 30 generates an electron beam. The electron beam incidents on a surface of the target sample 20 through the conductive shielding tube 104. The target sample 20 generates secondary electrons and backscattered electrons traveling in a same direction. Medium/low angle backscattered electrons are detected by the third detector 105, and the secondary electrons and high angle backscattered electrons continue to move forwards through a central hole of the third detector 105. Some of the secondary electrons and the high-angle backscattered electrons are reflected by an outer surface of a conical structure of the conductive shielding tube 104 and enter the reflective energy analyzer 101, and some of the secondary electrons and the high-angle backscattered electrons directly enter the reflective energy analyzer 101. The reflective energy analyzer 101 separates the secondary electrons and the high-angle backscattered electrons, the first detector 102 receives the separated secondary electrons, and the second detector 103 receives the separated high-angle backscattered electrons.

It should be noted that reference throughout this specification to "an embodiment," "some embodiments," "an example," "a specific example," or "some examples," means that a particular feature, structure, material, or characteristic described in connection with the embodiment or example is included in at least one embodiment or example of the present disclosure. In this specification, the schematic representations of the above terms do not necessarily refer to the same embodiment or example. Furthermore, the particular features, structures, materials, or characteristics may be combined in any suitable manner in one or more embodiments or examples.

In the description of the present disclosure, it is to be understood that, terms such as "center", "longitudinal", "lateral", "length", "width", "thickness", "over", "below", "front", "back", "left", "right", "vertical", "horizontal", "top", "bottom", "in", "out", "clockwise", "anti-clockwise", "axial", "radial" and "circumference" refer to the directions and location relations which are the directions and location relations shown in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure.

In addition, the terms such as "first" and "second" are used herein for purposes of description and are not intended to indicate or imply relative importance, or to implicitly show the number of technical features indicated. Thus, the feature defined with "first" and "second" may explicitly or implicitly comprise one or more this feature. In the description of the present disclosure, "a plurality of" means at least two, for example, two or three, unless specified otherwise.

In the present disclosure, unless specified or limited otherwise, the terms "mounted," "connected," "coupled" and "fixed" are understood broadly, such as fixed, detachable mountings, connections and couplings or integrated, and can be mechanical or electrical mountings, connections and couplings, and also can be direct and via media indirect mountings, connections, and couplings, and further can be inner mountings, connections and couplings of two components or interaction relations between two components. For those skilled in the art, the specific meaning of the above-mentioned terms in the embodiments of the present disclosure can be understood according to specific circumstances.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from spirit, principles and scope of the present disclosure.

What is claimed is:

1. An electron detection device, comprising:
   a reflective energy analyzer comprising a first control electrode and a second control electrode that are sequentially arranged in an incidence direction of an electron beam, the first control electrode being configured to generate a first electric field between the first control electrode and the second control electrode;
   a first detector disposed at a side of the second control electrode away from the first control electrode, the first detector being configured to receive a secondary electron generated by the electron beam acting on a target sample;
   a second detector disposed at a side of the first control electrode away from the second control electrode, the second detector being configured to receive a backscattered electron generated by the electron beam acting on the target sample; and
   a conductive shielding tube penetrating the first control electrode and the second control electrode in the incidence direction of the electron beam, the conductive shielding tube being configured to shield an electric field generated by the reflective energy analyzer, allowing the electron beam to pass through and be incident on the target sample,
   wherein the first control electrode has an axisymmetric structure and has a through hole at a center of the first control electrode, the through hole being provided to allow the electron beam to pass through, a centerline of the through hole coinciding with a symmetry axis;
   the first control electrode extends outwards from the symmetry axis as a center to form an extension surface, the extension surface being a curved surface with a downward opening, and a side of the curved surface away from the symmetry axis pointing towards the first detector, wherein the symmetry axis is an axis where the incidence direction of the electron beam is located; and
   the second control electrode has a same shape as the first control electrode, and the second control electrode and the first control electrode together define an interlayer, enabling the first electric field formed within the interlayer to guide the secondary electron to be deflected onto the first detector and received by the first detector.

2. The electron detection device according to claim 1, wherein the reflective energy analyzer further comprises a third control electrode, the third control electrode being disposed at the side of the first control electrode away from the second control electrode in the incidence direction of the electron beam and being penetrated by the conductive shielding tube, wherein:
the second detector is disposed at a side of the third control electrode away from the first control electrode; and
the first control electrode is further configured to generate a second electric field between the first control electrode and the third control electrode, the second electric field being configured to guide the backscattered electron to the second detector.

3. The electron detection device according to claim 2, wherein each of the third control electrode, the first control electrode, and the second control electrode is of a netlike structure or a perforated structure.

4. The electron detection device according to claim 3, wherein the conductive shielding tube is symmetrically disposed about the axis where the electron beam incident direction is located.

5. The electron detection device according to claim 2, wherein the conductive shielding tube is symmetrically disposed about the axis where the electron beam incident direction is located.

6. The electron detection device according to claim 1, wherein the conductive shielding tube is symmetrically disposed about the axis where the electron beam incident direction is located.

7. The electron detection device according to claim 6, wherein a part of the conductive shielding tube close to the target sample has a conical structure with an opening.

8. The electron detection device according to claim 7, further comprising:
a third detector disposed at a side of the first detector away from the second control electrode, the third detector being configured to receive the backscattered electron generated by the electron beam acting on the target sample, wherein:
an exit angle of the backscattered electron received by the third detector is smaller than an exit angle of the backscattered electron received by the second detector; and
each of the third detector, the second detector, and the first detector has a hollow annular structure, the hollow annular structure being symmetrical about the axis where the incidence direction of the electron beam is located.

9. A scanning electron microscope, comprising:
an electron source configured to generate an electron beam; and
an electron detection device, the electron detection device being configured to detect the secondary electron and the backscattered electron that are generated by the electron beam acting on the target sample, and the electron detection device comprising:
a reflective energy analyzer comprising a first control electrode and a second control electrode that are sequentially arranged in an incidence direction of an electron beam, the first control electrode being configured to generate a first electric field between the first control electrode and the second control electrode;
a first detector disposed at a side of the second control electrode away from the first control electrode, the first detector being configured to receive a secondary electron generated by the electron beam acting on a target sample;
a second detector disposed at a side of the first control electrode away from the second control electrode, the second detector being configured to receive a backscattered electron generated by the electron beam acting on the target sample; and
a conductive shielding tube penetrating the first control electrode and the second control electrode in the incidence direction of the electron beam, the conductive shielding tube being configured to shield an electric field generated by the reflective energy analyzer, allowing the electron beam to pass through and be incident on the target sample,
wherein the first control electrode has an axisymmetric structure and has a through hole at a center of the first control electrode, the through hole being provided to allow the electron beam to pass through, a centerline of the through hole coinciding with a symmetry axis;
the first control electrode extends outwards from the symmetry axis as a center to form an extension surface, the extension surface being a curved surface with a downward opening, and a side of the curved surface away from the symmetry axis pointing towards the first detector, wherein the symmetry axis is an axis where the incidence direction of the electron beam is located; and
the second control electrode has a same shape as the first control electrode, and the second control electrode and the first control electrode together define an interlayer, enabling the first electric field formed within the interlayer to guide the secondary electron to be deflected onto the first detector and received by the first detector.

10. The scanning electron microscope according to claim 9, wherein the reflective energy analyzer further comprises a third control electrode, the third control electrode being disposed at the side of the first control electrode away from the second control electrode in the incidence direction of the electron beam and being penetrated by the conductive shielding tube, wherein:
the second detector is disposed at a side of the third control electrode away from the first control electrode; and
the first control electrode is further configured to generate a second electric field between the first control electrode and the third control electrode, the second electric field being configured to guide the backscattered electron to the second detector.

11. The scanning electron microscope according to claim 10, wherein each of the third control electrode, the first control electrode, and the second control electrode is of a netlike structure or a perforated structure.

12. The scanning electron microscope according to claim 9, wherein the conductive shielding tube is symmetrically disposed about the axis where the electron beam incident direction is located.

13. The scanning electron microscope according to claim 12, wherein a part of the conductive shielding tube close to the target sample has a conical structure with an opening.

14. The scanning electron microscope according to claim 13, wherein the electron detection device further comprises:
a third detector disposed at a side of the first detector away from the second control electrode, the third detector being configured to receive the backscattered electron generated by the electron beam acting on the target sample, wherein:
an exit angle of the backscattered electron received by the third detector is smaller than an exit angle of the backscattered electron received by the second detector; and each of the third detector, the second detector, and the first detector has a hollow annular structure, the hollow annular structure being symmetrical about the axis where the incidence direction of the electron beam is located.

15. The scanning electron microscope according to claim 9, further comprising:
a voltage tube having an accommodation cavity, the accommodation cavity being provided to accommodate the electron detection device;
a condenser arranged around the voltage tube and disposed between the electron source and the electron detection device, the condenser being configured to converge the electron beam; and
an objective lens arranged around the voltage tube and disposed between the electron detection device and the target sample, the objective lens being configured to focus the electron beam onto the target sample,
wherein the voltage tube is configured to accelerate the electron beam prior to the electron beam reaching the electron detection device, and decelerate the electron beam through a retarding electric field formed between the voltage tube and the objective lens subsequent to the electron beam passing through the electron detection device, and reversely accelerate the secondary electron and the backscattered electron that are generated by the target sample.

16. The scanning electron microscope according to claim 15, wherein the electron detection device further comprises a conductive shielding tube, the conductive shielding tube penetrating the first control electrode and the second control electrode in the incidence direction of the electron beam, the conductive shielding tube being symmetrical about the axis where the incidence direction of the electron beam is located, and the conductive shielding tube being at a same potential as the voltage tube and configured to shield the electric field generated by the reflective energy analyzer, allowing the electron beam to pass through and be incident on the target sample.

17. The scanning electron microscope according to claim 16, wherein:
a potential of the objective lens is a ground potential;
a potential of the target sample is a ground potential or a negative potential; and
a potential of the voltage tube is a positive potential.

18. The scanning electron microscope according to claim 15, wherein:
a potential of the objective lens is a ground potential;
a potential of the target sample is a ground potential or a negative potential; and
a potential of the voltage tube is a positive potential.

* * * * *